US010725361B1

(12) United States Patent
Mukhanov et al.

(10) Patent No.: US 10,725,361 B1
(45) Date of Patent: Jul. 28, 2020

(54) SUPERCONDUCTING OPTICAL-TO-DIGITAL CONVERTER

(71) Applicant: Hypres, Inc., Elmsford, NY (US)

(72) Inventors: Oleg A. Mukhanov, Putnam Valley, NY (US); Igor V. Vernik, Yorktown Heights, NY (US)

(73) Assignee: SeeQC Inc., Elmsford, NY (US)

( * ) Notice: Subject to any disclaimer, the term of this patent is extended or adjusted under 35 U.S.C. 154(b) by 0 days.

(21) Appl. No.: 16/149,910

(22) Filed: Oct. 2, 2018

Related U.S. Application Data

(60) Provisional application No. 62/566,852, filed on Oct. 2, 2017.

(51) Int. Cl.
*H03M 1/00* (2006.01)
*G02F 7/00* (2006.01)
*H03M 1/12* (2006.01)

(52) U.S. Cl.
CPC .............. *G02F 7/00* (2013.01); *H03M 1/12* (2013.01)

(58) Field of Classification Search
CPC .......... H03M 1/12; H03M 1/128; H03M 5/16; G02F 7/00; G02F 2001/212; G02F 1/225; G02F 1/11; G02F 1/01; G02F 1/065; G02F 1/0147; G02F 1/13318; G02F 2203/05
USPC ........................................ 341/137, 155, 142
See application file for complete search history.

(56) References Cited

U.S. PATENT DOCUMENTS

| | | | | |
|---|---|---|---|---|
| 6,288,659 B1* | 9/2001 | Jalali | .................... | H03M 1/1215 341/137 |
| 6,771,201 B1* | 8/2004 | Currie | ..................... | H03M 1/12 341/137 |
| 8,055,318 B1* | 11/2011 | Kadin | ................... | H01L 39/125 505/190 |
| 9,197,471 B1* | 11/2015 | Zanoni | ................... | H04L 27/223 |
| 9,590,740 B1* | 3/2017 | Pace | ......................... | G01S 3/48 |
| 9,618,591 B1* | 4/2017 | Radparvar | ............ | G01R 33/50 |
| 10,069,619 B1* | 9/2018 | Zanoni | ................ | H03M 1/1245 |
| 2003/0076251 A1* | 4/2003 | Gupta | ................... | G04F 10/005 341/133 |
| 2007/0223936 A1* | 9/2007 | Babbitt | ..................... | G01J 9/04 398/182 |
| 2011/0234436 A1* | 9/2011 | Bogoni | ..................... | G02F 7/00 341/137 |

* cited by examiner

*Primary Examiner* — Linh V Nguyen
(74) *Attorney, Agent, or Firm* — Hoffberg & Associates; Steven M. Hoffberg

(57) ABSTRACT

A system and method to convert a wideband optical signal to a multi-bit digital electrical signal using a superconducting integrated circuit. In a preferred embodiment, the optical signal modulates the phase (i.e., adjusts the timing) of a sequence of single-flux-quantum voltage pulses. The optoelectronic modulator may comprise an optically tunable Josephson junction, superconducting inductor, or bolometric detector, with switching speeds approaching 100 ps or less. The optical signal may comprise a plurality of optical signals such as a wavelength-division multiplexed signal. The optical-to-digital converter may be applied to high-speed digital communication switches, broadband digital input/output for superconducting or quantum computing, and control/readout of detector arrays.

21 Claims, 13 Drawing Sheets

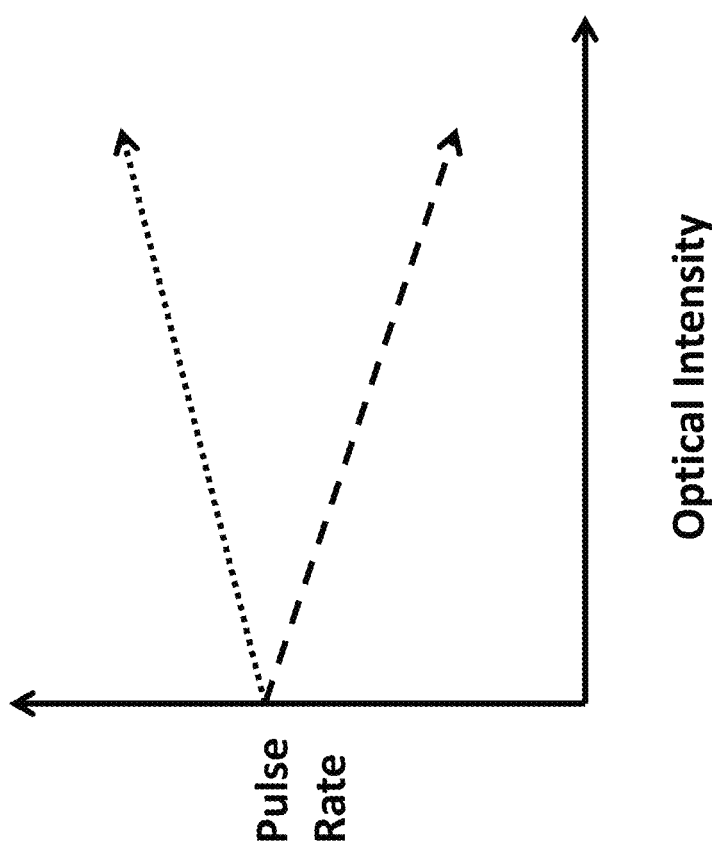

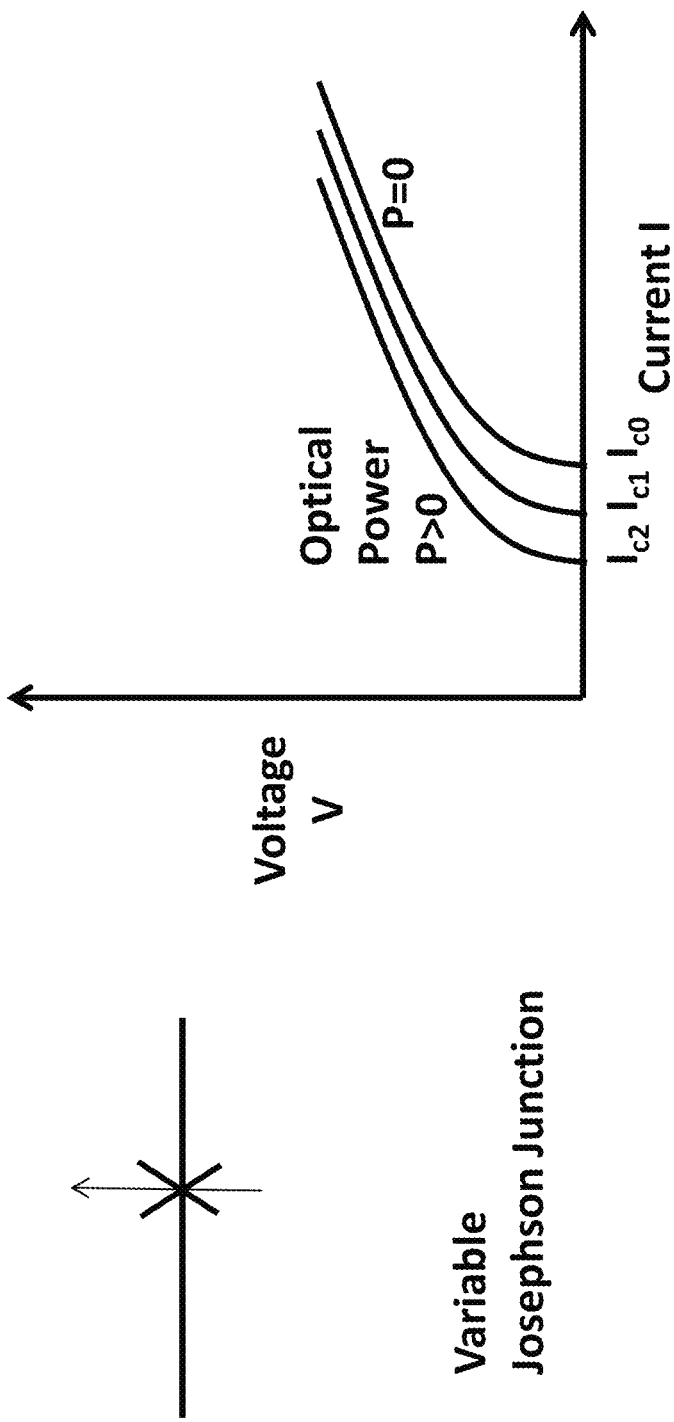

SUPERCONDUCTING OPTICAL-TO-DIGITAL CONVERTER

CROSS REFERENCE TO RELATED APPLICATIONS

The present application is a non-provisional of, and claims benefit of priority from, U.S. Provisional Patent Application No. 62/566,852, filed Oct. 2, 2018, the entirety of which is expressly incorporated herein by reference.

FIELD OF THE INVENTION

The present invention relates to the field of analog to digital converters, and more particularly to analog optical signal digitizers.

BACKGROUND OF THE INVENTION

Each reference cited herein is expressly incorporated herein by reference in its entirety for all purposes.

Analog-to-Digital Converters, or ADCs, are essential components that convert data from analog sensors and receivers to the digital domain. Most commercial ADCs are based on semiconductor transistors and operate near room temperature. For certain applications, newer superconducting ADCs that operate at cryogenic temperatures near 4 K have been developed. See, for example, the following U.S. Pat. Nos. 3,983,419; 4,082,991; 4,393,357; 4,586,010; 4,694,276; 4,837,604; 4,904,882; 4,943,556; 4,956,642; 4,962,086; 4,977,402; 4,983,971; 4,990,462; 5,021,658; 5,064,809; 5,075,253; 5,171,732; 5,189,420; 5,198,815; 5,252,294; 5,345,114; 5,347,086; 5,347,143; 5,399,881; 5,400,026; 5,455,511; 5,536,947; 5,543,988; 5,550,389; 5,619,139; 5,629,838; 5,680,018; 5,687,112; 5,773,875; 5,780,314; 5,863,868; 5,869,958; 5,878,334; 5,892,243; 5,900,618; 5,912,503; 5,916,848; 5,939,730; 5,992,354; 6,000,225; 6,051,440; 6,066,600; 6,105,381; 6,115,233; 6,157,329; 6,166,317; 6,235,067; 6,284,586; 6,301,330; 6,313,587; 6,329,139; 6,331,805; 6,348,699; 6,365,912; 6,387,329; 6,439,253; 6,453,264; 6,486,756; 6,495,854; 6,509,853; 6,570,224; 6,608,518; 6,608,581; 6,610,367; 6,617,987; 6,649,929; 6,653,962; 6,710,343; 6,728,113; 6,759,010; 6,759,974; 6,771,201; 6,798,083; 6,916,719; 6,949,887; 6,962,823; 6,980,142; 7,019,391; 7,034,660; 7,038,604; 7,075,467; 7,084,691; 7,133,375; 7,144,553; 7,151,209; 7,180,074; 7,224,041; 7,233,144; 7,259,373; 7,272,431; 7,280,623; 7,289,197; 7,289,312; 7,330,369; 7,362,125; 7,365,663; 7,375,417; 7,395,166; 7,403,580; 7,436,910; 7,436,911; 7,436,912; 7,440,490; 7,471,224; 7,488,960; 7,489,537; 7,489,745; 7,495,242; 7,495,244; 7,495,245; 7,495,592; 7,496,158; 7,498,897; 7,501,644; 7,501,877; 7,507,960; 7,511,496; U.S. Pat. Nos. 7,535,005; 7,554,369; 7,560,932; 7,598,897; 7,630,227; 7,659,526; 7,659,981; 7,680,474; 7,687,409; 7,692,270; 7,701,220; 7,719,280; 7,719,392; 7,719,453; 7,728,748; 7,733,253; 7,864,560; 7,869,221; 7,869,974; 7,875,876; 7,876,869; 7,917,798; 7,928,875; 7,944,253; 7,956,640; 7,982,646; 7,986,218; 7,991,013; 7,993,813; 8,022,854; 8,031,510; 8,045,364; 8,045,660; 8,050,648; 8,055,235; 8,055,318; 8,073,631; 8,076,249; 8,078,130; 8,081,946; 8,084,762; 8,093,900; 8,130,880; 8,149,894; 8,159,825; 8,169,081; 8,179,133; 8,184,673; 8,188,901; 8,198,621; 8,217,381; 8,249,129; 8,249,540; 8,260,143; 8,260,144; 8,260,145; 8,274,817; 8,278,027; 8,301,104; 8,324,897; 8,390,100; 8,399,365; 8,401,050; 8,401,509; 8,401,600; 8,406,834; 8,416,109; 8,423,103; 8,423,297; 8,441,154; 8,450,716; 8,462,889; 8,466,583; 8,493,771; 8,509,354; 8,509,368; 8,514,986; 8,521,117; 8,565,345; 8,587,915; 8,593,141; 8,604,791; 8,618,799; 8,648,287; 8,653,497; 8,658,994; 8,664,767; 8,664,955; 8,698,570; 8,729,524; 8,736,452; 8,744,541; 8,754,396; 8,787,873; 8,804,358; 8,811,536; 8,867,931; 8,872,690; 8,895,913; 8,901,778; 8,901,779; 8,901,928; 8,904,809; 8,907,531; 8,912,687; 8,912,805; 8,922,066; 8,928,276; 8,933,520; 8,933,594; 8,933,695; 8,937,255; 8,946,938; 8,953,950; 8,957,549; 8,970,217; 8,977,223; 9,019,679; 9,020,079; 9,020,362; 9,036,319; 9,054,094; 9,065,423; 9,065,452; 9,077,412; 9,097,769; 9,105,555; 9,106,203; 9,110,249; 9,154,172; 9,165,979; 9,166,731; 9,213,085; 9,225,918; 9,252,825; 9,261,573; 9,276,615; 9,312,760; 9,312,878; 9,312,895; 9,324,733; 9,344,069; 9,367,288; 9,373,592; 9,392,957; 9,395,425; 9,400,127; 9,400,214; 9,401,240; 9,425,838; 9,442,066; 9,450,696; 9,453,814; 9,464,350; 9,509,315; 9,515,025; 9,520,180; 9,548,878; 9,554,303; 9,554,738; 9,565,385; 9,577,690; 9,588,191; 9,589,686; 9,602,168; 9,608,672; 9,614,532; 9,618,591; 9,647,194; 9,661,596; 9,693,694; 9,696,397; 9,698,607; 9,705,571; 9,742,429; 9,748,937; RE37259; RE44097; 20020060635; 20020154029; 20020177769; 20030076251; 20030179831; 20040022332; 20040120299; 20040195512; 20040217748; 20040217822; 20060017488; 20060145750; 20060170535; 20060197943; 20070055133; 20070075752; 20070077906; 20070081611; 20070098058; 20070194225; 20070223936; 20070293160; 20080048902; 20080049885; 20080101444; 20080101501; 20080101503; 20080107213; 20080186064; 20080252293; 20090073017; 20090140739; 20090153381; 20090168286; 20090232191; 20090232507; 20090232510; 20090265112; 20100026537; 20100026538; 20100057653; 20100066576; 20100149011; 20100259261; 20110054236; 20110109310; 20110210811; 20110288823; 20120062230; 20120062345; 20120082283; 20120112531; 20120112532; 20120112534; 20120112535; 20120112536; 20120112538; 20120112691; 20120119569; 20120119575; 20120119576; 20120119698; 20120123693; 20120157321; 20120166117; 20120184338; 20120198591; 20120213531; 20120223709; 20120228952; 20120228953; 20120228954; 20120235500; 20120235501; 20120235502; 20120235503; 20120235504; 20120235566; 20120235567; 20120235633; 20120235634; 20120239117; 20120242159; 20120242225; 20120244290; 20120248886; 20120248887; 20120248888; 20120248981; 20120256494; 20120274494; 20120328301; 20130004180; 20130036078; 20130253302; 20130272453; 20130315597; 20140013724; 20140027638; 20140097846; 20140113828; 20140166868; 20140199490; 20140233942; 20140266202; 20140285198; 20140286465; 20150061404; 20150069831; 20150078290; 20150125155; 20150137830; 20150143817; 20150219732; 20150229343; 20150236546; 20150255994; 20150333536; 20150338478; 20160028402; 20160028403; 20160033597; 20160087687; 20160091578; 20160097718; 20160161550; 20160197628; 20160245852; 20160267032; 20160283197; 20160292586; 20160292587; 20160324438; 20170026175; 20170134091; 20170163301; 20170176623; 20170179973; 20170244450; 20170244453; 20170244454; 20170244455; and 20170265158; See also Mukhanov, "Superconductor Analog-to-Digital Converters", Proceedings of the IEEE, vol. 92, p. 1564, 2004.

Superconducting ADCs typically use integrated circuits with many Josephson junctions, and are based on single-flux-quantum (SFQ) pulses. These fast pulses, typically 2 ps wide and 1 mV high, are naturally generated by a Josephson junction biased above the critical current $I_c$ (see FIG. 1), and are responsible for the high speed, low power, and sensitivity of these ADCs. Josephson junctions biased below $I_c$ can regenerate and transmit SFQ pulses, forming an active Josephson transmission line (JTL) that provides the basis of rapid-single-flux-quantum (RSFQ) digital logic (see FIG. 2). These ADCs typically have sampling rates in excess of 20 GHz, and can digitize rapidly varying radio signals with bandwidths in excess of 10 GHz. The ADCs can be integrated with RSFQ digital signal processing on the same chip. In general, superconducting ADCs offers the best combination of broad bandwidth, low power, and high sensitivity of any electronic technology.

One type of prior-art superconducting ADC is known as a phase-modulation-demodulation ADC (PMD). In this system, as shown in FIG. 3 (taken from Mukhanov 2004), an analog electrical input modulates a periodic pulse train of SFQ pulses, either advancing or retarding a given pulse. This asynchronous pulse train is subsequently synchronized, integrated, and averaged, in order to generate additional effective bits. The concept of a PMD ADC has also been embodied in other technologies. For example, Tanoni, U.S. Pat. No. 9,356,704, discloses an analog electrical signal modulating an optical pulse train, which is subsequently demodulated to generate electrical bits.

While radio waves are widely used for propagating broadband signals in free space, an alternative mode for long-distance communication is via light on optical fibers. The signals can propagate for long distances with little attenuation. Typical optical carriers are infrared light with wavelength 1.2-1.7 µm. See en.wikipedia.org/wiki/Fiber-optic-_communication. Optical signals may also be used for imaging and for intra-computer and inter-computer communication.

In most cases, an electrical signal is modulated onto the optical carrier at the transmission end, and demodulated at the receiving end. A wide variety of technologies can be used for modulators and transducers that operate near room temperature, including electro-optic, magneto-optic, acousto-optic, photoelastic, and electro-absorptive effects. See, for example, www.rp-photonics.com/optical_modulators.html.

Because of the extremely high optical frequencies, many broadband multi-GHz signals can be carried on the same optical fiber, using a technology known as Wavelength-Dispersive Multiplexing (WDM). See, for example, en.wikipedia.org/wiki/Wavelength-division multiplexing. In some cases, a set of integrated micro-ring waveguides can be used as add-drop multiplexers, to consolidate or split off the various component wavelengths. See for example, U.S. Pat. Nos. 7,539,418; 8,805,130; 2015/0168748; also Q. Xu, et al., "Cascaded silicon micro-ring modulators for WDM optical interconnection", Optics Express, vol. 14, p. 9431, 2006, from which FIG. 4 was copied.

There have been several approaches in the prior art to digitizing such optical signals. One approach is to demodulate the optical signal to generate a radio-frequency electrical signal, and then use an electrical ADC to generate a digital representation. However, a system that integrates these functions together should be more efficient and compact. U.S. Pat. No. 5,850,195 provides a monolithic light-to-digital signal converter. Other patents for broadband optical digitizers include U.S. Pat. Nos. 6,265,999; 7,564,387; 8,514,115; 8,725,004; 8,730,562.

These optical ADCs should be distinguished from optically-enhanced electrical ADCs, where the input and output signals are electronic, but optical elements are used in part of the sampling or quantizing. Low-jitter optical clocks may be used, or precision optical delay lines. For example, U.S. Pat. No. 6,771,201, Hybrid Photonic Analog-to-Digital Converter, discloses a system whereby a train of optical pulses are used to generate a train of fast electrical pulses using superconducting devices, which are then used as a sampling clock for a superconducting ADC. But the signal to be quantized is an electrical signal, not an optical signal. Other optically-enhanced electrical ADCs (which have sometimes been labeled "photonic ADCs") are disclosed in the following U.S. Pat. Nos. 7,876,246; 6,100,831; 6,661,361; and 6,700,517. See also: U.S. Pat. Nos. 3,999,063; 4,078,232; 4,209,853; 4,294,127; 4,320,484; 4,502,037; 4,712,089; 4,770,483; 4,851,840; 4,926,177; 4,928,007; 5,097,473; 5,101,270; 5,264,849; 5,267,139; 5,381,147; 5,403,040; 5,552,881; 5,583,950; 5,627,920; 5,636,050; 5,892,151; 5,982,932; 6,064,507; 6,118,397; 6,175,320; 6,188,342; 6,326,910; 6,404,365; 6,404,366; 6,420,984; 6,420,985; 6,434,173; 6,469,649; 6,469,817; 6,525,682; 6,529,150; 6,636,681; 6,671,298; 6,686,997; 6,713,224; 6,714,149; 6,754,631; 6,771,201; 6,784,466; 6,873,468; 6,956,653; 7,016,421; 7,050,182; 7,083,998; 7,124,036; 7,194,139; 7,212,140; 7,233,261; 7,245,795; 7,294,446; 7,327,913; 7,350,939; 7,362,931; 7,397,979; 7,400,703; 7,420,505; 7,483,600; 7,564,387; 7,570,184; 7,715,720; 7,787,767; 7,801,395; 7,858,949; 7,940,201; 7,956,788; 7,967,764; 7,990,299; 8,026,837; 8,126,298; 8,263,928; 8,269,658; 8,334,797; 8,384,978; 8,432,153; 8,442,402; 8,446,305; 8,456,336; 8,466,819; 8,514,115; 8,548,331; 8,593,716; 8,618,966; 8,655,176; 8,686,712; 8,692,774; 8,725,004; 8,779,955; 8,836,703; 8,886,726; 8,902,095; 8,902,096; 8,928,510; 8,953,950; 8,954,554; 8,963,751; 8,965,211; 9,001,619; 9,045,970; 9,176,361; 9,197,471; 9,201,287; 9,329,413; 9,341,921; 9,350,458; 9,389,326; 9,395,456; 9,413,372; 9,438,263; 9,442,205; 9,450,597; 9,450,696; 9,467,223; 9,502,856; 9,557,433; 9,571,731; 9,612,304; 9,645,377; 9,647,827; 9,716,553; 9,734,285; 9,746,743; 9,772,414; RE28954; RE35766; 20020067299; 20020163454; 20040001016; 20040096143; 20060072186; 20070110362; 20070140613; 20070274733; 20080088502; 20090142051; 20100002281; 20100201345; 20100277354; 20110002029; 20110182587; 20110234435; 20120212360; 20120213531; 20130062508; 20130315597; 20130328706; 20140067300; 20150323852; and 20160087716.

A number of fast optical detectors and modulators have been developed for cryogenic environments, including both semiconducting and superconducting photosensitive elements. Semiconductor devices include a metal-semiconductor-metal (MSM) diode, and low-temperature-deposited GaAs, and generally function by increasing the density of charge carriers. Other novel materials such as graphene may also be used at cryogenic temperatures. See, for example, Phare, "Graphene electro-optic modulator with 30 GHz bandwidth", Nature Photonics, vol. 9, p. 511 (2015).

Superconducting optical detectors include Josephson junctions, ultrathin niobium nitride films (NbN), superconducting tunnel junctions, and transition-edge sensors. The superconducting devices can be configured to be quite sensitive to weak optical intensities, with output signals that are well matched to superconducting readout circuits. Detection mechanism may include nonequilibrium heating of the superconductor (see Ilin, "Picosecond hot-electron relaxation in NbN superconducting photodetectors", Applied Physics Letters, vol. 76, p. 2752, 2000), or altering the conductance of a Josephson junction or tunnel barrier (see Andreozzi, "Tunneling characteristics of Pb—CdS—Pb light-sensitive Josephson Junctions," IEEE Trans. on Appl. Supercond., vol. 19(3), p. 983, 1983). The critical current of an element may change, or its kinetic inductance, or its resistance, in a transient manner that recovers quickly, on the 100 ps timescale or faster. Sensors may be sensitive to the signal of a single photon, particularly for photons in the infrared or visible range. Detectors may also provide spectral information, i.e., determine the energy of a single photon. See, for example, the following U.S. Pat. Nos. 6,812,464; 9,500,519; 2014/0353476; 6,815,708; 5,039,951; 5,057,485; 5,880,468; 6,239,431; 8,761,848; 9,577,176; 9,523,777; also JP 5,158,920.

There have been several systems for using optical pulses to generate SFQ pulses. See, for example, Kaplounenko, U.S. Pat. No. 5,963,351, "Digital Optical Receiver with Instantaneous Clock Recovery Circuit", issued 1999; Sobolewski, "Ultrafast optoelectronic interface for digital superconducting electronics", Superconductor Science and Technology, vol. 14, pp. 994-1000 (2001); Shinada et al., "1550 nm band optical input module with superconducting SFQ circuit", Applied Physics Letters, vol. 96, 182504 (2010). In these systems, the optical intensity is not measured, but the detector serves just as an on-off switch.

Another type of readout scheme for a superconducting sensor that provides intensity information is to couple it to a superconducting resonator. If the optical signal causes an inductance, capacitance, or resistance of such a resonator to change, this will alter the spectral response of the resonator. Alternatively, a superconducting quantum interference device or SQUID has also been used in the prior art as an output device, generally as a low-noise analog amplifier. While a SQUID may also be used as a fast digital device, this mode has not been reported in connection with optical sensors. See Chevernak, "Superconducting multiplexer for arrays of transition-edge sensors", Applied Physics Letters, vol. 74, p. 4043 (1999); Mazin, "Digital readouts for large microwave low-temperature detector arrays", Nuclear Instruments and Methods in Physics A, vol. 559, p. 799 (2006). While these systems disclose conversion to digital signals, this is implemented in a separate digital processing system not integrated with the detection. See, Mazin, B. A., Day, P. K., Leduc, H. G., Vayonakis, A. & Zmuidzinas, J. Superconducting kinetic inductance photon detectors. Proc. SPIE 4849, 283-293 (2002). citeseerx.ist.psu.edu/viewdoc/download?doi=10.1.1.562.6076&rep=rep1&type=pdf Thus, there have been no reported multi-bit digital integrated readout schemes of fast superconducting optical sensors on the multi-GHz timescale.

There have also been efforts to provide a modulated optical output from digital superconducting devices (digital-to-optical conversion), but this has been very difficult to implement due to the severe mismatch in voltage and energy levels, so these have not been reduced to practice. Several US Patents that address this include the following: U.S. Pat. Nos. 6,661,560; 6,476,956; 5,886,809; 5,566,015; 5,110,792 2002/0105948. Unpublished application Ser. No. 15/356,030 also addresses this issue. Superconducting digital-to-optical conversion is not a subject of the present invention.

What is needed is a fast analog-to-digital converter that is integrated with a fast cryogenic optical demodulator, for converting a broadband optical signal to a multi-bit digital broadband superconducting signal.

SUMMARY AND OBJECTS OF THE INVENTION

In a preferred embodiment of an optical-to-digital converter, the converter comprises a voltage pulse generator, a pulse synchronizer, and a digital counter, as illustrated in FIG. 5. The voltage pulse generator generates a rapid sequence of voltage pulses, whereby the rate of pulse generation depends on the intensity of an optical signal that is coupled to the voltage pulse generator. The generator is configured so that in the absence of an optical signal, the pulse generation rate will be constant. In the general case where the intensity of the optical signal varies with time, the pulse output rate from the pulse generator will also vary with time, comprising an asynchronous pulse train, i.e., one where the intervals between the pulses vary with time. The optical signal therefore modulates the voltage pulse train, where the modulation may be viewed as a pulse time modulation or as a phase modulation. This effect of this is to produce a modulated pulse train that is similar to the phase modulation in a phase-modulation ADC of the prior art (FIG. 3). In order to demodulate the phase modulation, a synchronizer and integrator are required, as in the phase-modulation ADC.

The asynchronous pulse train of the pulse time modulated output may be sent to a synchronizer, a circuit driven by a fast sampling clock (i.e., a periodic voltage signal) that measures the presence of one or more input pulses within a clock interval. The synchronizer may be a one-bit synchronizer, or alternatively a multi-bit synchronizer.

In order to demodulate the modulated signal, the number of pulses from the generator in a given time interval is measured. This requires sending the signal from the synchronizer to a counter/integrator, which is reset by a trigger from a counting clock, and accumulates the synchronizer outputs until the next counting trigger. The counter may also suppress the baseline counts corresponding to zero optical intensity.

The output of the counter is a multi-bit digital signal that represents the optical input intensity. However, if the digital signal is oversampled relative to the highest frequency component present in the optical intensity (higher than the Nyquist frequency), additional bits of precision may be created by averaging the output of the counter for a longer time, corresponding to intervals defined by the averaging clock. In some cases, the functions of the counter and the averager may be combined into an integrated digital filter. In other cases, these digital processing functions may be partitioned into two or more modules that may be carried out on different substrates or using different digital logic technologies. Various topologies of digital filter may be implemented. See, en.wikipedia.org/wiki/Digital filter; dsp-book.narod.ru/DSPCSP/20.pdf; calhoun.nps.edu/bitstream/handle/10945/28951/highspeedrecursi00loom.pdf; podelise.ru/tw_files/132/d-131687/7z-docs/1.pdf.

For example, some functions of the synchronizer, counter, and averager may be implemented using superconducting circuits similar to those in the phase-modulation demodulation ADC of FIG. 3. Other functions could be implemented using more conventional silicon technology on a DSP chip or FPGA (field programmable gate array), which may operate at room temperature.

FIGS. 6A and 6B show that there may be two general approaches, in any device technology, to optical modulation of a voltage pulse stream. A pulse generator is normally followed by a pulse propagation line, which functions as a delay line. In FIG. 6A, the optical signal directly alters the pulse generation rate. In FIG. 6B, the optical signal alters the time delay associated with the delay line.

As indicated in FIG. 7, an optical signal may either increase or decrease the effective pulse rate. Ideally, the modulation response should be linear with the optical intensity for at least a portion of the range. Nonlinearity may be accommodated through appropriate digital processing, but tends to cause mixing of different frequency components, which is undesirable.

In a preferred embodiment, the core elements of the optical-to-digital ADC comprise superconducting circuits based on Josephson junctions. For example, a Josephson junction may be responsive to an optical signal, which may alter its critical current L or its effective resistance R (for currents I>>$I_c$). FIG. 8A shows a symbolic representation of a variable Josephson junction, with an arrow across the junction. FIG. 8B is an I-V plot, which shows the change due to a progressive decrease in L with increasing optical power. This may occur due to heating of the Josephson junction, since an increased temperature T is known to decrease $I_c$. However, equilibrium heating or cooling of an entire chip is likely to be too slow to be practical. Transient heating only of the conduction electrons in a superconducting ultrathin film may respond much more quickly on a time of nanoseconds down to picoseconds. If such a film is an electrode of a Josephson junction, "electron heating" will reduce $I_c$. For current I<$I_c$, a Josephson junction acts as a (nonlinear) inductance (or "kinetic inductance") of order $h/4\pi e I_c$ (where h=Planck's constant and e is the charge on the electron), so electron heating of a Josephson junction can act as a variable inductance. This is also true of a superconducting film below its critical current; it can act as a "kinetic inductance bolometer".

The superconducting optoelectronic modulator may be designed to be sensitive to very weak optical intensity, even down to that of a single photon. In this way, a superconducting optical-to-digital converter may be closely integrated with a superconducting detector or array of such detectors. This should enable compact and efficient direct digital readout of a sensitive focal-plane imaging system.

BRIEF DESCRIPTION OF THE DRAWINGS

FIG. 1A shows the circuit symbol together with the time-average voltage <V>, and FIG. 1B shows fast generation of voltage pulses V(t).

FIG. 7 shows examples of dependence of voltage pulse rate on optical intensity.

FIGS. 8A and 8B show a symbolic representation of a variable Josephson junction (FIG. 8A), and an I-V plot (FIG. 8B), where the critical current $I_c$ is dependent on optical intensity.

DETAILED DESCRIPTION OF THE PREFERRED EMBODIMENTS

FIGS. 1-4 describe prior-art technology of superconducting and optical devices that may be used in preferred embodiments of the proposed new optical-to-digital converter.

FIGS. 1A and 1B describe the electrical properties of a Josephson junction of the prior art, indicated in a circuit by an "X". A Josephson junction is a weak superconductor link connecting two superconducting wires. For a current below a characteristic critical current $I_c$ (which may be of order 0.1-1 mA), a Josephson junction acts as an ideal lossless superconductor. For larger currents, the Josephson junction develops a voltage and becomes resistive, with a typical resistance of order 1-10 ohms, as shown in the dc I-V curve of FIG. 1B.

Strictly speaking, the Josephson junction is a fast dynamic device, and the plot of FIG. 1B shows the instantaneous voltage V(t), which gives rise to the average voltage <V> in FIG. 1A. For current just above the critical current, V(t) corresponds to a series of fast voltage pulses, each pulse having integrated voltage of one flux quantum $\Phi_0$=h/2e=2.07 mV-ps. An actual SFQ (single-flux-quantum) pulse is rounded rather than rectangular (as in FIG. 1B) with a typical pulse height of order 1 mV, and effective pulse width of order 2 ps, depending on circuit parameters. The pulse frequency is f=<V>$\Phi_0$.

A Josephson junction is also characterized by an effective capacitance C and nonlinear inductance $L_J$, where typically $L_J$~10 pH and C~1 pF. This would correspond to an LC resonator, except that it is damped by the resistance R. An underdamped Josephson junction tends to ring, and has an undesirable hysteretic I-V curve. An overdamped Josephson junction tends to have wide pulses, slowing down the dynamic operation. The optimum mode of operation is near critical damping, where the Q of the resonator is near 1. A physical Josephson junction may be based on a niobium tunnel junction, and tends to be underdamped. A practical Josephson junction may comprise a tunnel junction with a parallel resistive shunt added to bring the combined device near critical damping. The Josephson junctions discussed herein should be assumed to be damped junctions, which may include a resistive shunt. Other types of damping may be used.

Figure 1:
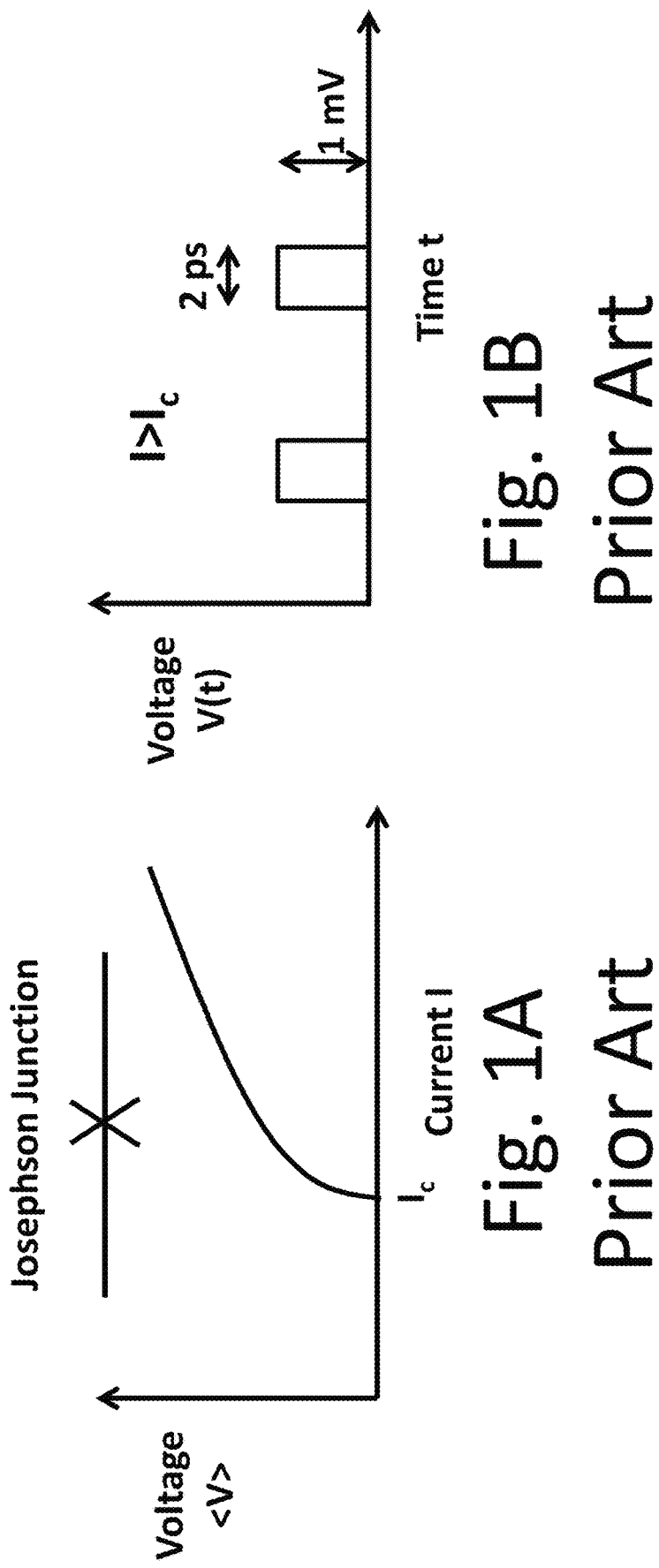
FIGS. 1A and 1B show the characteristics of a Josephson junction of the prior art.
Figure 2:
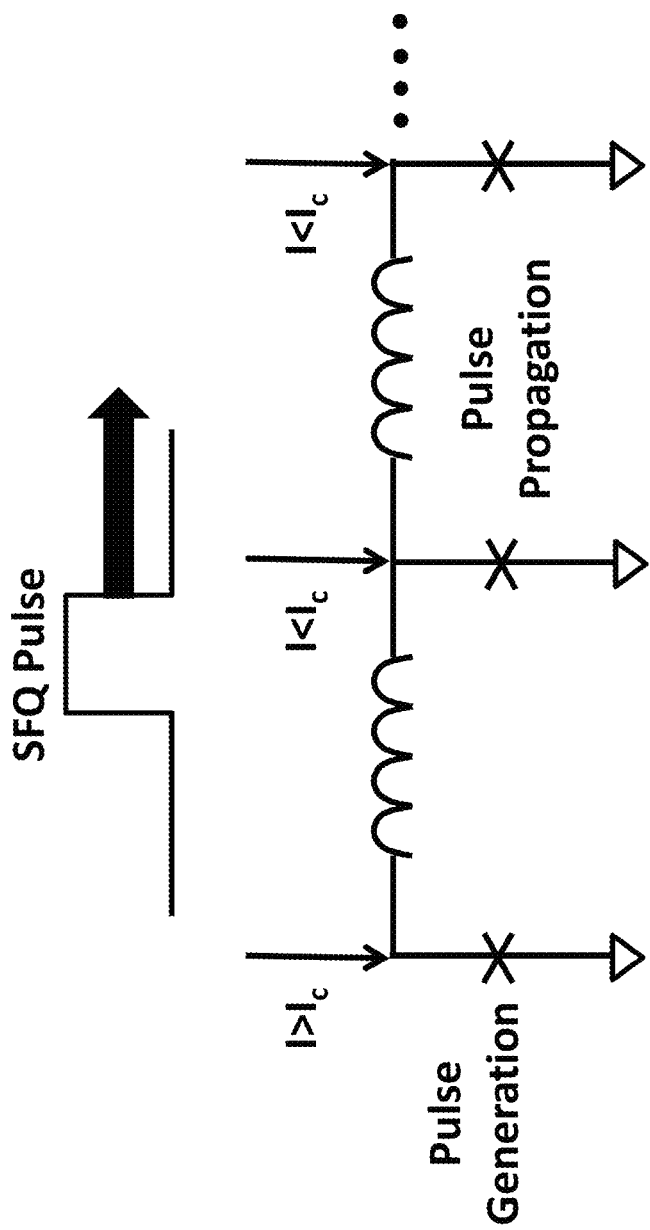
FIG. 2 shows a Josephson junction generator and pulse transmission line of the prior art.

FIG. 2 shows the operation of a Josephson transmission line of the prior art (see, for example, www.physics.sunysb.edu/Physics/RSFQ/Lib/PB/jtl.html), whereby a single SFQ pulse generated by the first Josephson junction on the left is regenerated by each junction in the sequence, thus propagating the pulse down the line. The generating junction is biased just above its critical current, while the propagating junctions are biased somewhat below their critical current (typically at ~70%). In addition to the Josephson junctions, the JTL comprises connecting inductances, where this inductance is a superconducting wire or microstripline. The inductance per stage is typically L=$\Phi_0/I_c$, since a larger inductance can cause an SFQ pulse to form a static trapped flux in the loop, rather than propagating. The propagation time through the JTL depends on both $I_c$ and L, and is typically several ps per stage. The JTL is a primary element used to connect gates in rapid-single-flux-quantum (RSFQ) logic, which may be applied to a preferred embodiment of the present invention.

Figure 3:
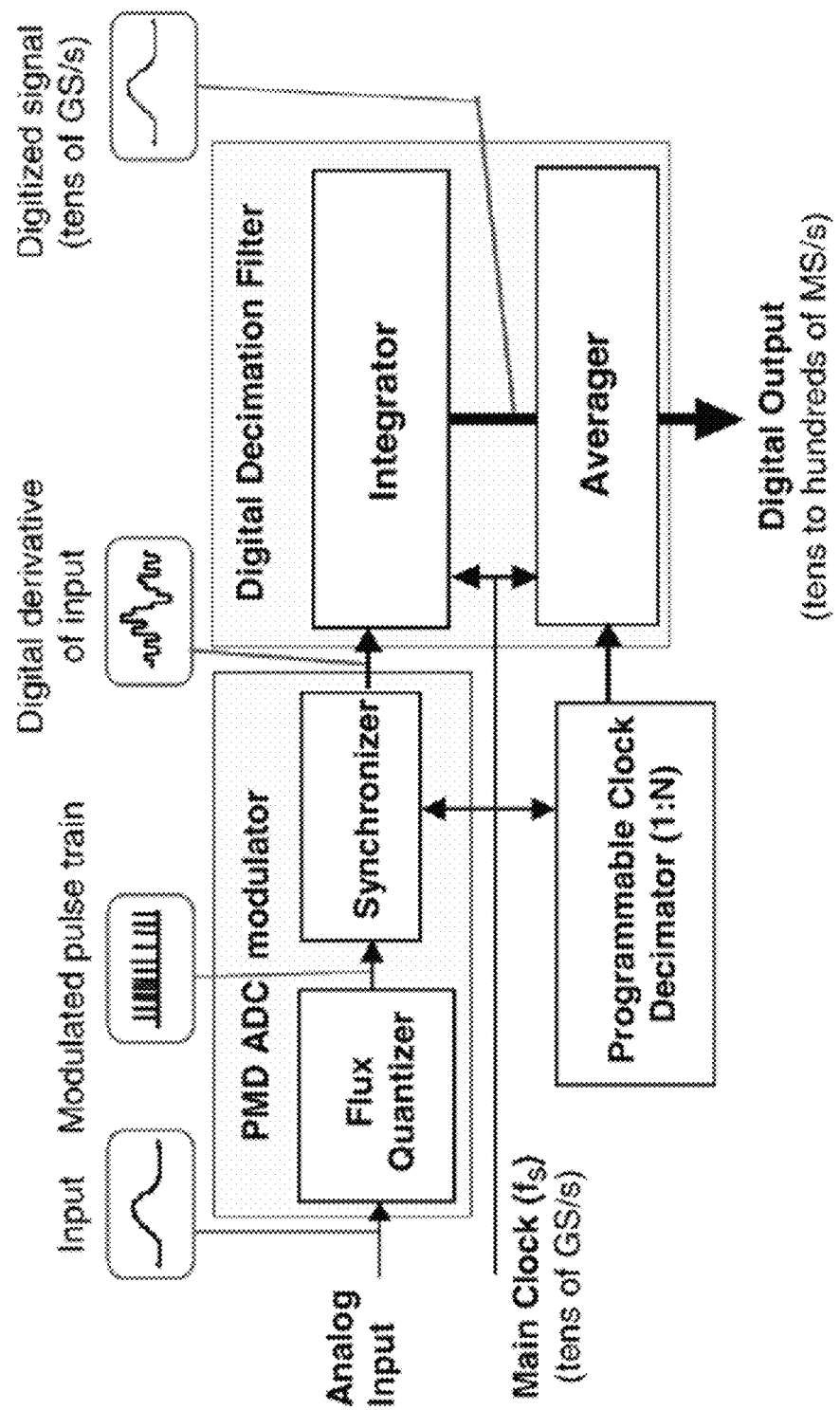
FIG. 3 shows a block diagram of a prior-art superconducting phase-modulation-demodulation analog-to-digital converter (ADC).

FIG. 3 shows a detailed block diagram of a phase-modulation-demodulation (PMD) ADC of the prior art. The preferred embodiment of this technology is based on RSFQ logic, but this could alternatively be implemented using another device technology. A rapidly varying analog signal (bandwidth up to ~1 GHz) enters on the left, and it modulates the pulse output of the "flux quantizer". A positive signal could increase the pulse rate, while a negative signal could decrease the rate. The resulting modulated pulse train enters the "synchronizer" block, which acts to demodulate the pulse sequence to recover a digital representation of the time-derivative of the input analog signal, at a sampling rate given by the main clock. For example, the unmodulated pulse rate could be 10 GHz, and the main clock could be 20 GHz. The quantizer and synchronizer together comprise the PMD ADC modulator. This derivative is then integrated (or summed) to regenerate a digital representation of the analog signal, and averaged to increase the effective number of bits and decrease the noise level. The clock for the integration and averaging may be a factor of N smaller than the main clock rate. The integrator and averager together may comprise a digital decimation filter. In a preferred embodiment, the ADC modulator and at least a portion of the digital decimation filter may be integrated on the same chip. The optical-to-digital converter of the present invention may employ some similar circuits to those in the phase modulation-demodulation analog-to-digital converter (PMD ADC).

Figure 4:
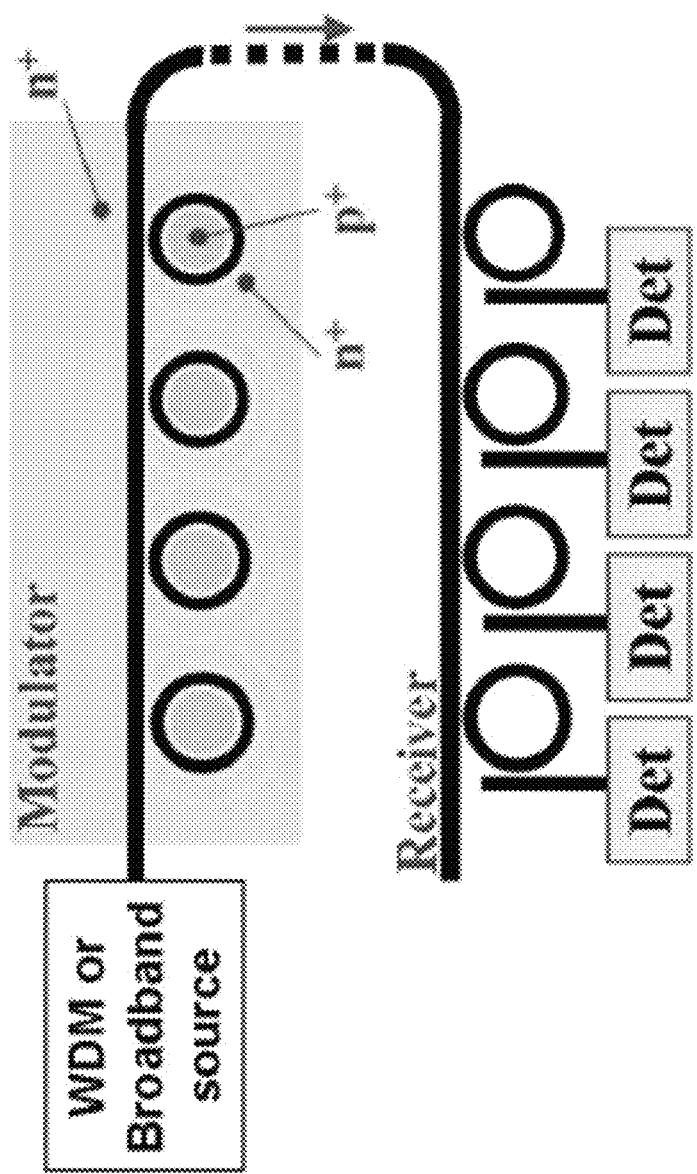
FIG. 4 shows a conceptual diagram of prior-art micro-ring optical resonators for a multiplexer and demultiplexer of a wavelength-division multiplexed (WDM) optical signal.

FIG. 4 presents a conceptual diagram of a wavelength-division multiplexed (WDM) optical communication system of the prior art. In this example, the transmitter comprises an optical carrier signal that is modulated by four separate electrical signals, preferably at slightly different wavelengths so as not to interfere. At the receiver, these four electrical signals are separated using a demultiplexer, and detected in parallel. The multiplexer and demultiplexer may comprise an array of integrated optical ring resonators, coupled to optoelectronic modulators.

Figure 5:
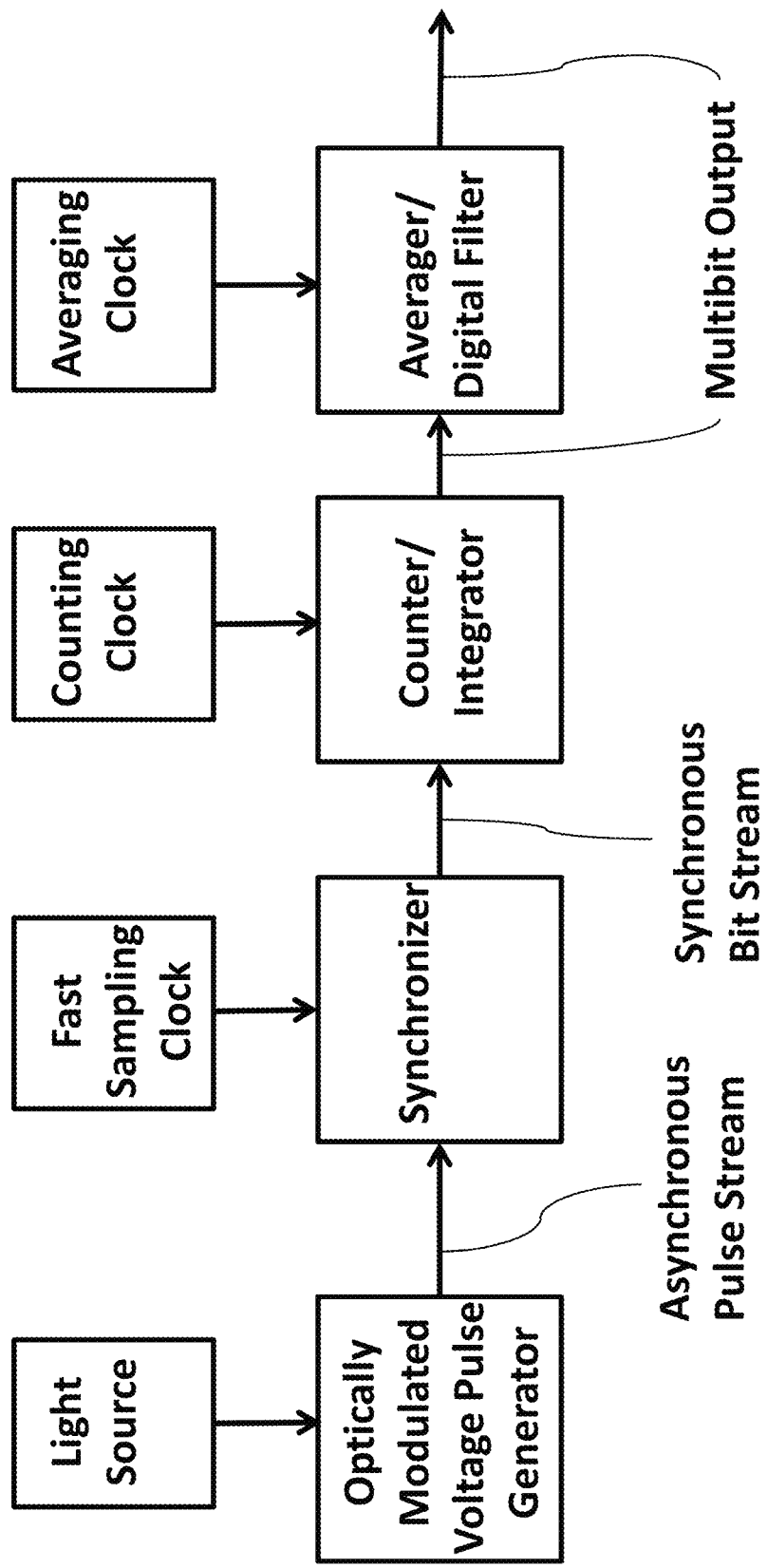
FIG. 5 shows a block diagram of a preferred embodiment of an optical-to-digital converter.

FIG. 5 shows a block diagram of a preferred embodiment of the optical-to-digital converter of the invention. A voltage pulse generator is modulated by an optical source. The asynchronous pulse train is then synchronized, integrated, and averaged in much the same way as PMD ADC. The unmodulated pulse rate might be 10 GHz, and the sampling clock might be twice this or 20 GHz. The integrator and averager could be combined into a single digital filter, or split into stages that are done in different technologies. The averaging clock $f_{av}$ determines the effective bandwidth of the digitizer; by the Nyquist relation, $BW=f_{av}/2$.

Figure 6B:
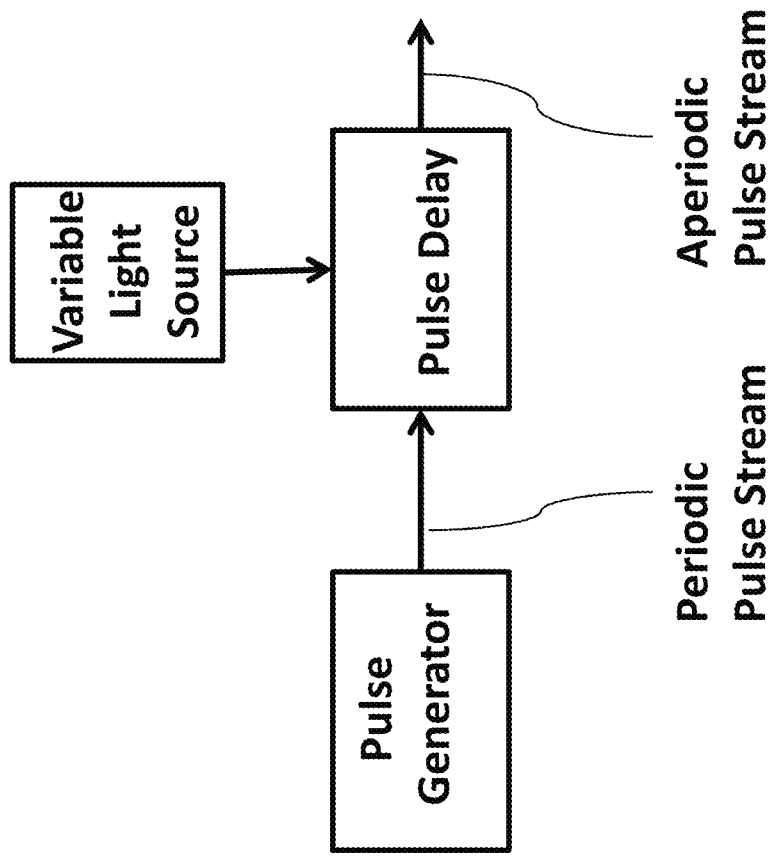
FIGS. 6A and 6B shows block diagrams of two alternative embodiments of an optically modulated voltage pulse generator: a direct optical pulse-rate modulator (FIG. 6A), and an optically modulated pulse delay (FIG. 6B).
Figure 6A:
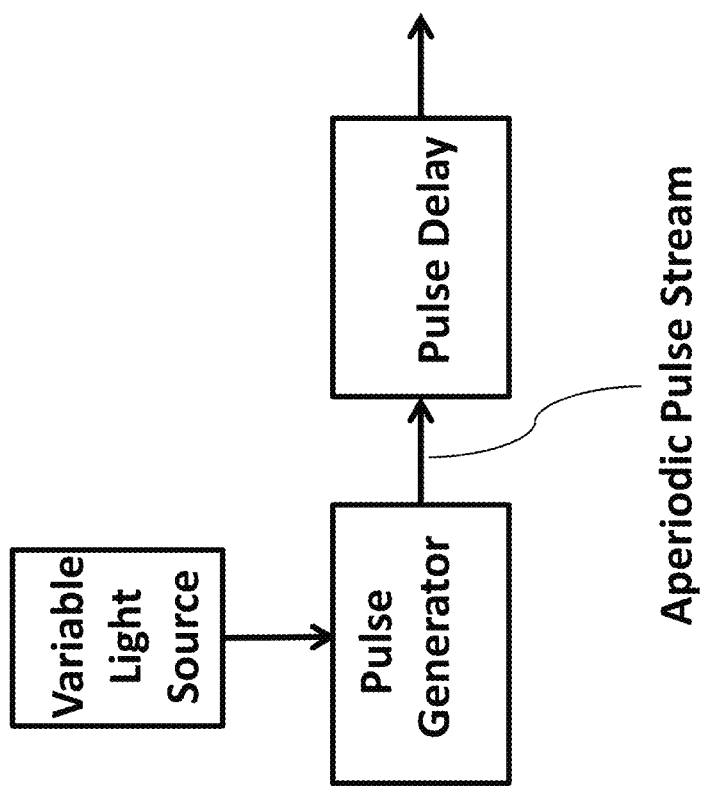

FIGS. 6A, 6B, and 7 address in general terms how a digital optical modulator might work. Either the pulse rate could be directly modulated by the light, or the pulse delay could be modulated by the light. FIG. 6A shows a mode whereby the pulse rate is directly modulated by the optical input. The pulse rate might either increase or decrease with increasing optical power, as shown in FIG. 7. In ideal cases, the change in the pulse rate $\Delta R$ may be linearly proportional to the optical power P. Linearity is preferred in communication systems, because nonlinearity tends to produce frequency mixing, generating frequency components where they would not otherwise be present. An alternative to direct optical modulation is shown in FIG. 6B, where the pulse delay associated with pulse propagation is either advanced or retarded by the optical power. In this case, a constant optical power would not change the average pulse rate, but a transient change in optical power dP/dt would cause a proportional change in pulse rate $\Delta R$. In either case, the digital representation of the optical power P(t) could be recovered, but the appropriate digital processing would differ.

FIG. 8A shows a symbol for a variable Josephson junction (a line with an arrow passing through the "X"), whereby at least one of the junction parameters could change under optical illumination. In one embodiment shown in the set of I-V curves in FIG. 8B, the critical current $I_c$ of the junction is decreased under optical illumination. For a fixed bias current with $I>I_c$, a decrease in L would cause an increase in voltage, and hence an increase in the generator pulse rate. For a current bias with $I<I_c$, a small optical power will change the current-dependent Josephson inductance, which can change the delay of a junction in pulse-propagating mode. Alternatively, in another embodiment, the junction resistance could change due to optical illumination, which could also change the pulse generation rate for $I>I_c$. There may be several mechanisms that could cause optical modulation in a Josephson junction. The critical current is normally a function of temperature, so that any type of non-equilibrium heating would also cause $I_c$ to decrease. Alternatively, optical illumination might affect the tunnel barrier connecting the two superconducting electrodes, which could affect both $I_c$ and R.

Figure 9:
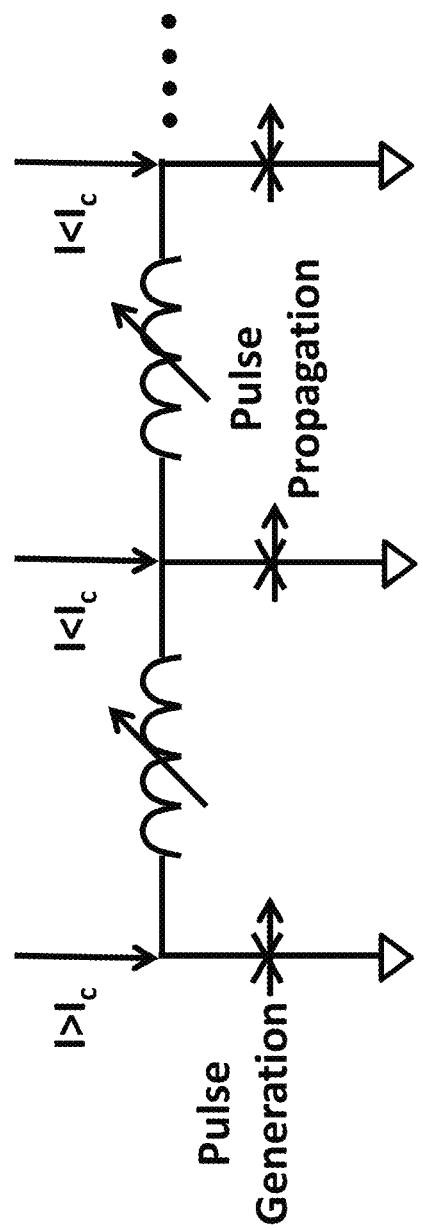
FIG. 9 shows a Josephson pulse generation/propagation circuit, where one or more Josephson junctions and/or inductors may be optically varied.

FIG. 9 shows the prior-art Josephson transmission line, where now one or more elements can be modulated by optical illumination, which could modulate the pulse generation rate, and/or the pulse delay rate. The modulated elements could include a Josephson junction, as well as a connecting superconducting inductor. A ring oscillator configuration may also be implemented.

A superconducting inductor will include at least a portion of its inductance as "kinetic inductance" associated with kinetic energy stored in the superconducting charge carriers. The kinetic inductance is dependent on temperature, and therefore on any nonequilibrium heating that affects the superconducting electrons. A very thin superconducting film of thickness $d<\lambda_L$ (the magnetic penetration depth of the superconductor) exhibits an enhanced kinetic inductance. Specifically, the kinetic inductance of a thin film per square is $\mu_0 \lambda_L^2/d$. So for example, if d=10 nm and $\lambda_L$=100 nm, the kinetic inductance is of order 1 pH/square, and tends to dominate the usual magnetic inductance.

Figure 10B:
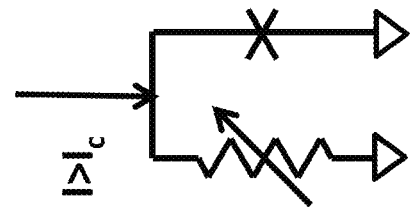
FIGS. 10A and 10B show alternative embodiments of a variable Josephson pulse generator.
Figure 10A:
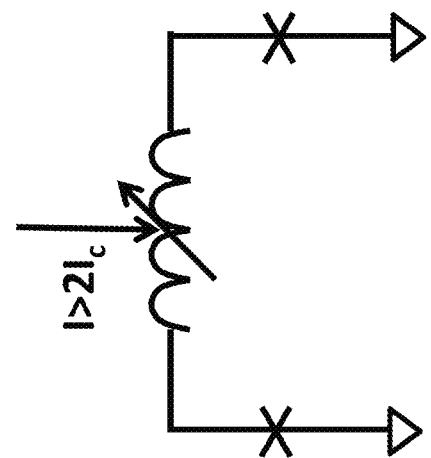

FIGS. 10A and 10B show how optical illumination may affect other superconducting circuit elements. FIG. 10A represents a SQUID, comprising two Josephson junctions in an inductive loop. The SQUID is equivalent to a single Josephson junction with a variable critical current. Even if the critical currents of the component junctions remain unchanged, the critical current of the SQUID is dependent on the flux contained in the superconducting loop. The flux can be varied by varying the loop inductance, which may be sensitive to optical illumination.

FIG. 10B represents a resistively shunted Josephson junction with an optically sensitive shunt resistance. This resistance might comprise a superconducting film with a critical temperature $T_c$ smaller than that of the Josephson junction. For example, the Josephson junction and connecting inductors might comprise niobium (Nb) with critical temperature $T_c$=9.2 K, while the resistor might comprise tantalum (Ta) with $T_c$=4.3 K. If the operating temperature is close to $T_c$ of the Ta film, its resistance will be sensitive to optical illumination that may produce transient heating. In these ways, these circuits can be used to create variable pulse generating or propagating elements.

Figure 11:
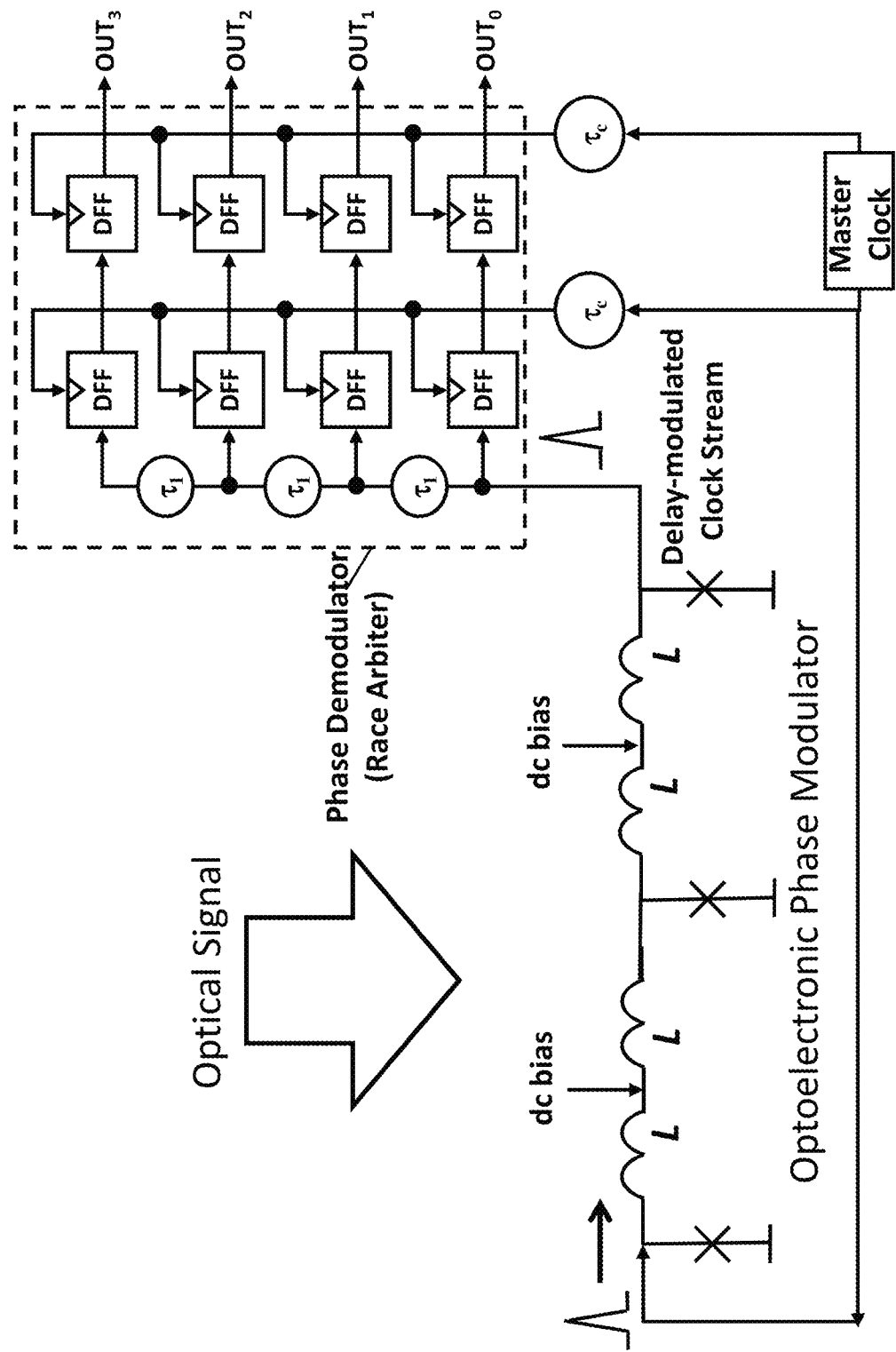
FIG. 11 shows a circuit diagram of one embodiment of Josephson delay line and synchronizer circuit for a superconducting optical-to-digital converter.

FIG. 11 shows a detailed circuit diagram of one preferred embodiment of a PMD optical modulator using RSFQ logic, similar in part to the PMD modulator of FIG. 3. The master clock generates a periodic pulse stream, which is fed to one or more JTL sections. Each section provides a small time delay, and these time delays may be modulated by light incident on one or more of the elements, either the Josephson junctions or the inductors. This represents a delay-type modulator, as shown in FIG. 6B. The asynchronous delay-modulated pulse stream then enters the synchronizer, which is labeled here as a race-arbiter-type phase demodulator. This synchronizer, quite similar to those in prior-art PMD ADCs, uses a set of data-flip-flops (DFF) to compare the arrival of clock pulses and data pulses. The DFF is a standard RSFQ cell that is also known as an RS flip-flop (for reset-set). See, for example, www.physics.sunysb.edu/Physics/RSFQ/Lib/AR/dff.html. This circuit is a multichannel synchronizer that uses a set of calibrated time delays (based on JTLs) to subdivide the clock period into 4 quantization levels, thus increasing the timing precision and increasing the effective resolution of the ADC.

Figure 12:
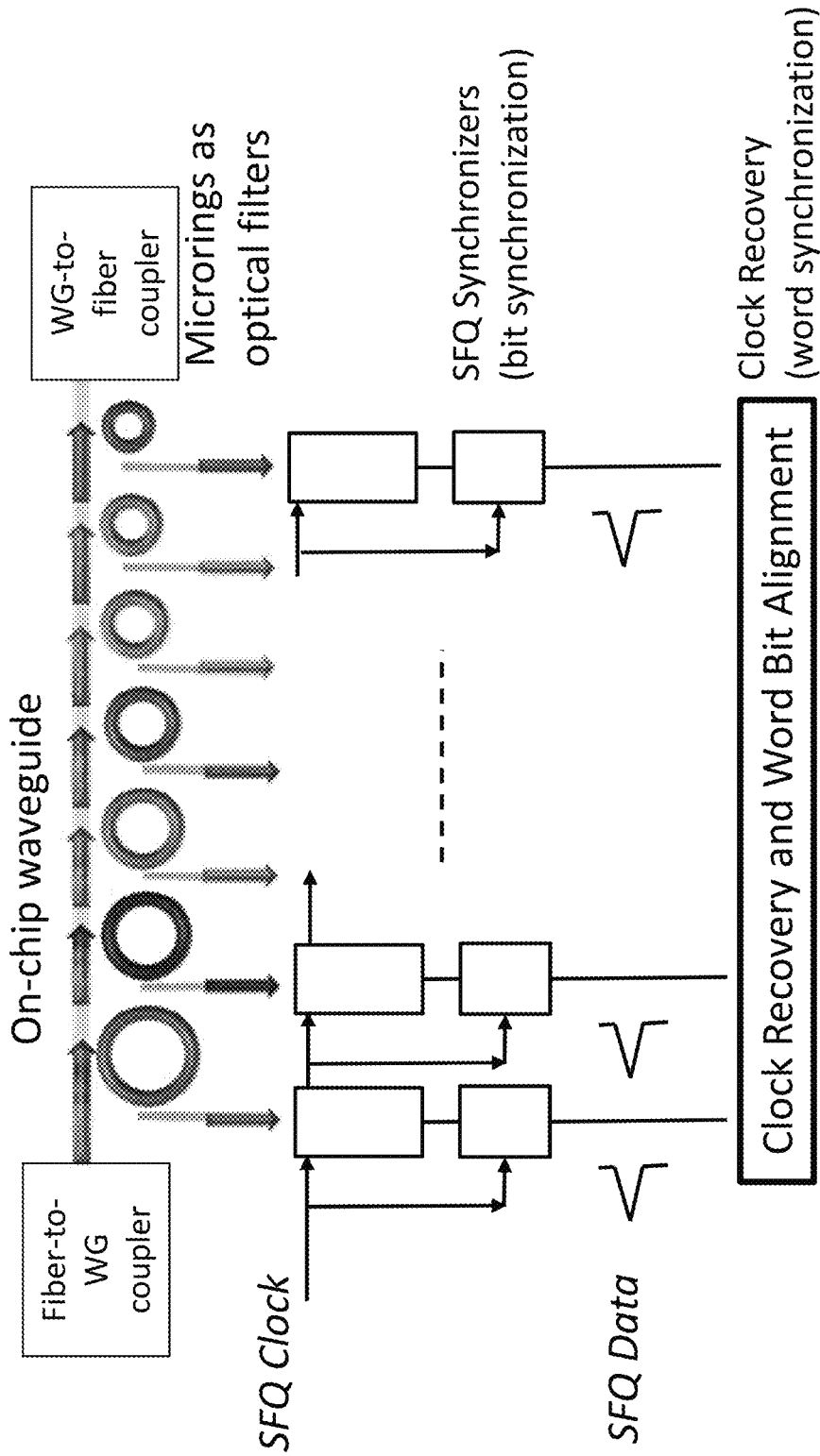
FIG. 12 shows a conceptual diagram of an integrated optical demultiplexer and array of superconducting optical-to-digital converters for a WDM optical signal.

FIG. 12 shows a conceptual diagram of an integrated multi-channel optical-to-digital receiver. This would be relevant for receiving and digitizing a WDM optical signal, comprising multiple signals modulated at slightly different wavelengths. The figure shows a demultiplexer that permits each signal to be coupled out using a set of integrated microring resonant waveguides. The waveguides are resonant for each wavelength, indicated in the figure by different size rings. Each of the wavelengths is coupled to a superconducting optical-to-digital converter, and each of the digital signals is sent out in parallel. In a preferred embodiment, both the demultiplexer array and the ADC array could be integrated on the same chip.

In order to correlate the various signals at their proper times, FIG. 12 also shows a clock recovery and word bit alignment circuit, also known as word synchronization.

Figure 13:
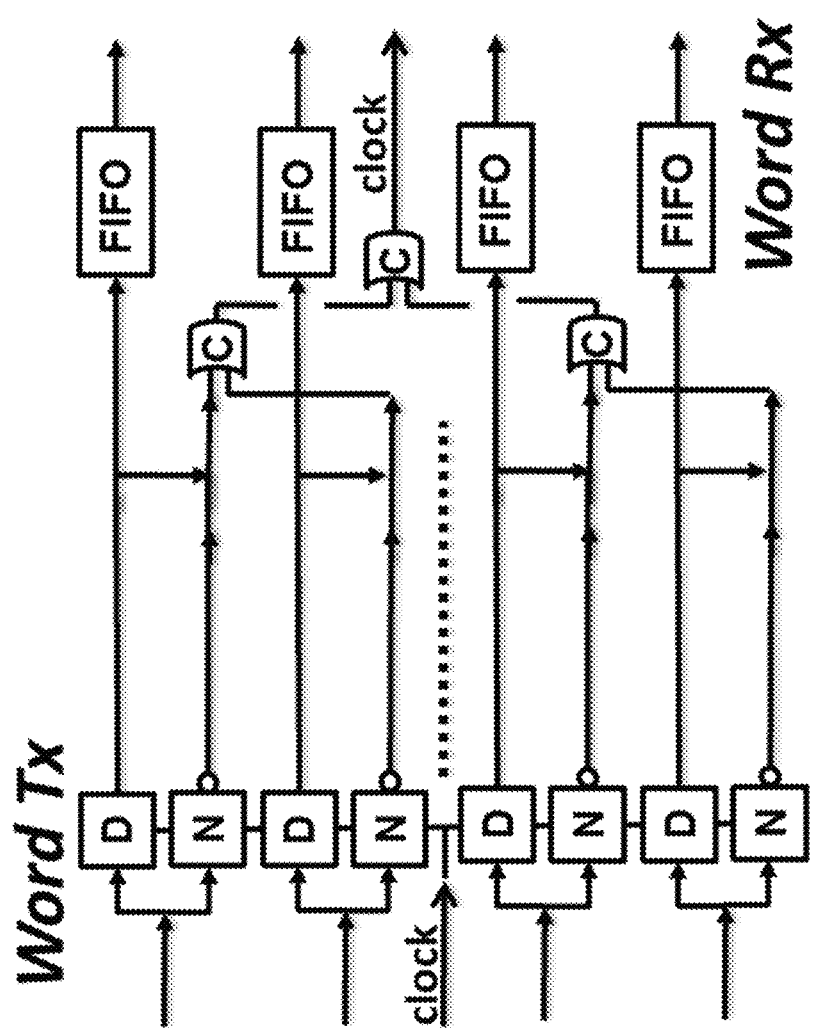
FIG. 13 shows a block diagram for a clock recovery and word bit alignment circuit that may be used with an array of optical-to-digital converters such as that in FIG. 12.

FIG. 13 shows one preferred embodiment of a word synchronization circuit, comprising a word transmit circuit on the chip, and a word receive circuit some distance away. Word synchronization circuits are known in other technologies, and are disclosed for RSFQ circuits in U.S. Pat. No. 9,520,180. In FIG. 13, D is the D-flip-flop, N is the inverter, C is the Muller C-element, and FIFO is a first-in-first-out shift register, all of which are standard RSFQ cells.

Such a superconducting optical-to-digital converter may be applied to general optical fiber communication systems, or alternatively to data transfer to other superconducting or cryogenic circuits. Such superconducting or cryogenic circuits may include RSFQ computing systems, cryogenic detector arrays, or cryogenic implementations of quantum computing. In many cases, signal bandwidths in excess of 1 GHz, or even in excess of 10 GHz, may be required. RSFQ digital processing is capable of these data rates, and properly implemented optoelectronic superconducting modulators also have sufficient bandwidth. For example, ultrathin superconducting films can change the effective electron temperature at GHz frequencies, without producing wider heating that would slow the response.

The embodiments presented here are not exclusive, but are used to illustrate the range of circuits and devices that may be functional components of superconducting optical-to-digital converters.

There has thus been shown and described systems and methods for optical-to-digital conversion which fulfill all the objects and advantages sought therefor. Many changes, modifications, variations, combinations, subcombinations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. An optical-to-digital converter comprising:
an input port configured to receive a variable intensity modulation optical signal;
a modulation circuit, comprising an optoelectronic transducer having a material exposed to the variable intensity modulation optical signal, configured to:
alter at least one electrical property of the material in response to an increase and a decrease of intensity of the variable intensity modulation of the optical signal, and
generate an aperiodic sequence of pulses having a multi-GHz pulse rate absent the variable intensity modulation optical signal, a change in a timing of the aperiodic sequence of pulses from the non zero multi-GHz pulse rate being responsive to at least the altered at least one electrical property of the material; and
a multibit circuit configured to accept the aperiodic sequence of pulses, and to generate a multibit digital representation of the variable intensity modulation of the optical signal.

2. The optical-to-digital converter of claim 1, wherein at least one of the optoelectronic transducer, the modulation circuit, and the multibit circuit comprise at least one Josephson junction.

3. The optical-to-digital converter of claim 1, wherein the modulation circuit and multibit circuit are each configured to operate at cryogenic temperatures.

4. The optical-to-digital converter of claim 1, further comprising an optical demultiplexer configured to demultiplex a multiplexed optical signal comprising the variable intensity modulation optical signal.

5. The optical-to-digital converter of claim 4, wherein the demultiplexer comprises at least one microring resonator.

6. The optical-to-digital converter of claim 1, wherein the sequence of pulses comprise a sequence of single-flux-quantum pulses.

7. The optical-to-digital converter of claim 1, wherein the multibit circuit comprises rapid-single-flux-quantum logic.

8. The optical-to-digital converter of claim 1, wherein the modulation circuit is responsive to an optical intensity of a single photon, such that the multibit digital representation has states which differ based on the optical intensity of the single photon.

9. The optical-to-digital converter of claim 1, wherein the modulation circuit and the multibit circuit are integrated on the same integrated circuit.

10. The optical-to-digital converter of claim 1, wherein the input port is configured to accept light from an optical fiber.

11. The optical-to-digital converter of claim 1, wherein the multibit digital representation has a linear dependence on the variable intensity modulation optical signal over a predetermined range of intensity, corresponding to a plurality of bits of the multibit digital representation.

12. The optical-to-digital converter of claim 1, wherein the at least one electrical property of the material altered in response to the variable intensity modulation of the optical signal comprises a kinetic inductance.

13. The optical-to-digital converter of claim 1, wherein the optoelectronic transducer comprises a superconducting bolometer.

14. The optical-to-digital converter of claim 1, wherein the aperiodic sequence of pulses comprises at least 20 billion pulses per second for at least one intensity modulation state of the variable intensity modulation optical signal.

15. The optical-to-digital converter of claim 1, wherein the timing of the aperiodic sequence of pulses is responsive to the variable intensity modulation optical signal having a bandwidth in excess of 10 GHz, to produce corresponding changes in the multibit digital signal.

16. The optical-to-digital converter of claim 1, wherein the multibit circuit comprises a synchronizer and a clock recovery circuit.

17. The optical-to-digital converter of claim 1, wherein the modulation circuit comprises a plurality of optical signal components linked to a plurality of different optoelectronic transducers.

18. The optical-to-digital converter of claim 1, wherein the modulation circuit further comprises an input configured to receive an optical clock signal, and the aperiodic sequence of pulses is generated dependent on the variable intensity modulation of the optical signal and the optical clock signal.

19. A method of optical-to-digital conversion, comprising:
    receiving an optical signal with a time-varying intensity;
    modulating a timing of a periodic train of pulses dependent on the time varying intensity of the optical signal, the periodic train of pulses having a multi-GHz rate at zero intensity of the optical signal; and
    demodulating the modulated timing of the periodic train of pulses to generate a multibit digital electrical representation of the optical intensity.

20. The method of claim 19, wherein the timing of the periodic train of pulses is modulated in a superconducting circuit.

21. An optical-to-digital converter comprising:
    an input port configured to receive an intensity modulated optical signal;
    an optoelectronic transducer comprising a superconducting circuit configured to generate an aperiodic sequence of pulses having a rate responsive to the intensity modulated optical signal, having a a multi-GHz rate when the intensity modulated optical signal has zero intensity; and
    a multibit circuit configured to generate a multibit digital dependent on the rate, representing an intensity of the intensity modulated optical signal.

* * * * *